United States Patent [19]
Ghezzo et al.

[11] Patent Number: 5,814,859
[45] Date of Patent: Sep. 29, 1998

[54] SELF-ALIGNED TRANSISTOR DEVICE INCLUDING A PATTERNED REFRACTING DIELECTRIC LAYER

[75] Inventors: Mario Ghezzo, Ballston Lake; Tat-Sing Paul Chow, Schenectady; James William Kretchmer, Ballston Spa; Richard Joseph Saia, Schenectady; William Andrew Hennessy, Niskayuna, all of N.Y.

[73] Assignee: General Electric Company, Schenectady, N.Y.

[21] Appl. No.: 558,297

[22] Filed: Nov. 15, 1995

Related U.S. Application Data

[62] Division of Ser. No. 406,440, Mar. 20, 1995, Pat. No. 5,510,281.

[51] Int. Cl.[6] .................. H01L 31/0312; H01L 29/76; H01L 29/94; H01L 31/062
[52] U.S. Cl. ..................... 257/335; 257/77; 257/336; 257/340
[58] Field of Search .................. 257/335, 336, 257/337, 338, 339, 340, 341, 342, 77

[56] References Cited

U.S. PATENT DOCUMENTS

| | | |
|---|---|---|
| 4,414,560 | 11/1983 | Lidow . |
| 4,642,674 | 2/1987 | Schoofs . |
| 5,019,522 | 5/1991 | Meyer et al. . |
| 5,023,678 | 6/1991 | Kinzer . |
| 5,045,900 | 9/1991 | Tamagawa . |
| 5,151,762 | 9/1992 | Uenishi et al. . |
| 5,179,034 | 1/1993 | Mori et al. . |
| 5,286,981 | 2/1994 | Lilja et al. ............... 257/132 |
| 5,322,802 | 6/1994 | Baliga et al. . |
| 5,338,945 | 8/1994 | Baliga et al. . |
| 5,420,450 | 5/1995 | Yoneda et al. ............ 257/341 |

OTHER PUBLICATIONS

"Dimos*—A Novel IC Technology with Submicron Effective Channel MOSFETs" by J. Tihanyi, et al, Tchnical Digest, 1977 International Electron Devices Meeting, 1977, pp. 399–401.

"Boron–Implanted 6H SIC Diodes" by Mario Ghezzo, et al, Appl. Phys. Let 63(9), Aug. 1993, pp. 1206–1208.

"Nitrogen–Implanted 6H–SIC Diodes Using High–Temperature Implanttion" by Ghezzo, et al, IEEE Electron Device Ltrs, vol. 134, No. 12, Dec. 1992, pp. 1–3.

Diffusion Self–Aligned Most: A New Approach for High Speed Device by Tarui, et al, Journal of the Japan Society of Applied Physics, vol. 39, Supp. 1970, pp. 105–110.

"Diffusion Self–Aligned Enhance–Depletion MOS–IC (DS A–ED–MOS–IC)" by Tarui, et al, Journal of the Japan Society of Applied Physics, vol. 40, Supp. 1971, pp. 193–198.

*Primary Examiner*—Ngân V. Ngô
*Attorney, Agent, or Firm*—Ann M. Agosti; Marvin Snyder

[57] ABSTRACT

A semiconductor device includes a semiconductor substrate having an epitaxial layer surface opposite a drain contact surface; a semiconductor layer adjacent to the epitaxial layer surface of the substrate, the semiconductor layer including material of a first conductivity type; a patterned refractory dielectric layer adjacent to the semiconductor layer; a base region of implanted ions in the semiconductor layer, the base region being of a second conductivity type; a source region of implanted ions in the base region, the source region being of the first conductivity type; a gate insulator layer adjacent to at least a portion of the source and base regions of the semiconductor layer; and a gate electrode over a portion of the gate insulator layer, adjacent to and in physical contact with an outer edge of the patterned refractory dielectric layer, and over at least a portion of the base region between the source region and the patterned refractory dielectric layer.

9 Claims, 11 Drawing Sheets

SELF-ALIGNED TRANSISTOR DEVICE INCLUDING A PATTERNED REFRACTING DIELECTRIC LAYER

This application is a division of application Ser. No. 08/406,440, filed Mar. 20, 1995, now U.S. Pat. No. 5,510,281.

BACKGROUND OF THE INVENTION

1. Field of the Invention

This invention relates generally to transistor devices and, more particularly, to self-aligned semiconductor devices having properties similar to doubly-diffused MOS devices.

2. Description of the Related Art

High voltage DMOS (double diffused metal oxide semiconductor) power devices have been developed for silicon technology with an important feature being a self-aligned diffusion of the source and base junctions using polysilicon gate masking to form a planar MOS channel between lateral terminations, as described for example in Y. Tarui, Y. Hayashi and T. Sekigawa, "Diffusion Self-Aligned Enhance-Depletion MOS-IC," Proc. 2nd Conf. Solid State Devices, Suppl. J. Jpn. Soc. Appl. Phys., 40, 193 (1971). High voltage capability is achieved by extending the drift region vertically across a lightly-doped epitaxial region, resulting in a dense layout and a low specific on-resistance having a theoretical lower limit of about 0.1 milliohm-cm$^2$. Conventional DMOS fabrication methods cannot be implemented in SiC because the dopant diffusivities are negligible in SiC at practical process temperatures. Furthermore, in conventional DMOS techniques, the gate electrode overlaps the drain's top surface termination, contributing to parasitic capacitance and reducing operating frequency.

The article of J. Tihanyi and D. Widman, "DIMOS—A Novel IC Technology with Submicron Effective Channel MOSFETs," Technical Digest of IEEE International Electron Devices Meeting, Dec. 5–7, 1977, Washington, D.C., pp. 399–401, describes a replacement of diffusion with ion-implantation which leads to a doubly-implanted MOS (DIMOS) transistor. These DIMOS transistors have only been described for integrated circuit technology and have been realized by subsequent ion implantation of donors and acceptors using a ramp-shaped polysilicon gate as an implantation mask. The ramp-shaped edge profile is difficult to control during etching, resulting in process complexity and uneven edges. Furthermore, the design does not offer a technique for ensuring a complete overlap of the polysilicon over the channel region.

SUMMARY OF THE INVENTION

An object of one embodiment of the invention is to provide a silicon carbide high voltage MOS power device having structural characteristics of a DMOS device. Because SiC has a higher critical electric field than silicon, the specific on-resistance of a SiC DMOS is expected to be significantly lower than that of a silicon DMOS with the same high voltage rating. A method of implementing vertical power SiC transistor is to replace the conventional double-diffusion with an edge-shifted double ion implantation sequence to overcome the problem of very small dopant diffusivity in SiC. The channel is formed by successive ion implantation of an acceptor atom (such as boron or aluminum) and a donor atom (such as nitrogen or phosphorous) to form the base and source regions, respectively. These implants are edge-shifted and have different depths with junctions formed by using spacers which add a margin around an initial mask edge with the second implantation region being shifted from the first region.

To permit self-registration between implant regions, the spacers lean against the edge of the mask. The implantations precede the gate electrode formation. If the mask comprises a material such as silicon dioxide, the mask wall used for spacer definition is not significantly eroded during a high temperature (1300°–1400° C.) activation, thereby enabling the later fabrication of a self-aligned refractory conductive gate electrode. The self-alignment procedure used for conventional silicon devices cannot be used for SiC because known metal-oxide-semiconductor structures fail to withstand the high temperature of implant activation of about 1500° C. Because the implanted areas are masked by spacers of different width leaning against the same mask walls, their lateral junctions are separated by a controlled spacing, which corresponds to the channel length.

In the present invention, gate-to-drain capacitance is reduced by either limiting the gate presence only to the channel or by at least partially separating the gate from the top drain surface with thick oxide. Because the gate electrode is edge-defined, submicron resolution can be obtained without high resolution lithography.

Briefly, according to an embodiment of the present invention, a method for fabricating a semiconductor device includes patterning a refractory dielectric layer over a semiconductor layer of a first conductivity type; conformally depositing a first spacer layer over the patterned refractory dielectric layer and the semiconductor layer; patterning the first spacer layer to leave a first spacer adjacent to an edge of the patterned refractory dielectric layer; implanting ions of a second conductivity type to form a base region in the semiconductor layer; conformally depositing a second spacer layer over the patterned refractory dielectric layer and the semiconductor layer; patterning the second spacer layer to leave a second spacer adjacent to an edge of the first spacer; implanting ions of the first conductivity type to form a source region in the base region; removing the first and second spacers; applying a gate insulator layer over at least a portion of the semiconductor layer; conformally depositing a gate electrode layer over the gate insulator layer and the semiconductor layer; and patterning the gate electrode layer to leave a gate electrode portion adjacent to an edge of the patterned refractory dielectric layer. Preferably the step of conformally depositing the gate electrode layer includes depositing a gate electrode layer having the same thickness as a combined width of the first and second spacers. In one embodiment the semiconductor layer includes silicon carbide, the patterned refractory dielectric layer includes silicon dioxide, the spacers include silicon nitride, and the gate electrode layer includes polysilicon.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Although the following description refers to an n type epitaxial layer vertical power metal oxide semiconductor field effect transistor (MOSFET) of the DMOS type for illustrative purposes, there are at least three related devices that can be made using the same process steps. The corresponding insulated gate bipolar transistor (IGBT) device is similar except for the change of substrate polarity to p+ type. A p type epitaxial layer vertical power MOSFET can be fabricated by reversing each of the polarities, with its corresponding IGBT having an n+ type substrate.

The following description refers to silicon carbide (SiC) for illustrative purposes because this invention is especially useful in SiC applications where diffusion is not a viable option. However, the present invention's self-aligning features make it attractive for use in other semiconductor materials as well.

Figure 1:
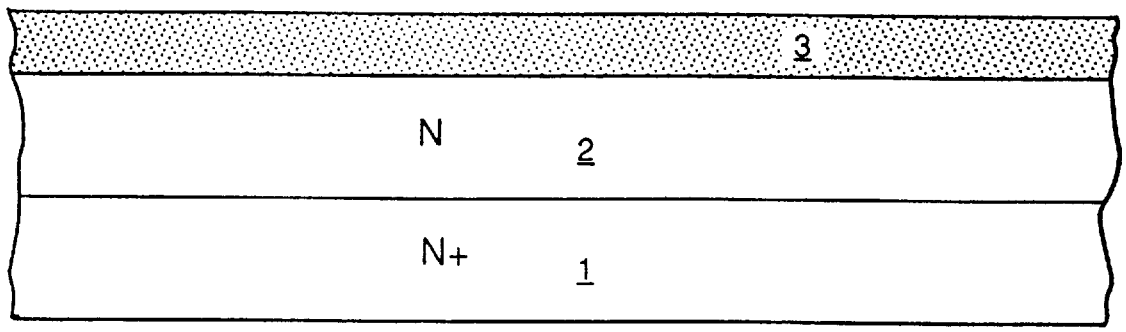
FIGS. 1–18 are sectional side views illustrating steps in a method for fabricating a self-aligned DMOS type device.

FIG. 1 is a sectional side view illustrating a refractory dielectric layer, shown as oxide layer 3, overlying an epitaxial layer 2 which in turn overlies a substrate 1. The substrate material preferably comprises a n+ 6H-SiC substrate having a thickness ranging from 500 to 600 micrometers with an impurity concentration ranging from $1 \times 10^{18}$ at/cm$^3$ to $5 \times 10^{19}$ at/cm$^3$. In one embodiment the substrate material is about 550 μm thick with an impurity concentration of $5 \times 10^{18}$ at/cm$^3$. The substrate can, if desired, include other polytypes of SiC, such as 4H, for example, as well as material in addition to or instead of SiC, such as silicon, diamond, and gallium nitride, for example.

The epitaxial layer is preferably an n type 6H-SiC epitaxial layer having a thickness ranging from 10 to 14 micrometers for a 1000 v breakdown voltage with a doping level ranging from 5 to $11 \times 10^{15}$ at/cm$^3$. In one embodiment the epitaxial layer is twelve micrometers thick with a doping level of $8 \times 10^{15}$ at/cm$^3$. The epitaxial layer can, if desired, include other polytypes of SiC as well as material in addition to or instead of SiC, such as silicon, diamond, and gallium nitride, for example.

The oxide layer preferably has a thickness ranging from 4000 to 6000 Å and, in one embodiment, comprises silicon dioxide which is deposited to a thickness of 5000 Å. The oxide layer should be able to withstand the high temperatures which are required for annealing implanted ions in SiC. Although silicon dioxide is the preferred material for oxide layer 3, other refractory dielectric materials such as aluminum oxide, for example, may be used.

Figure 2:
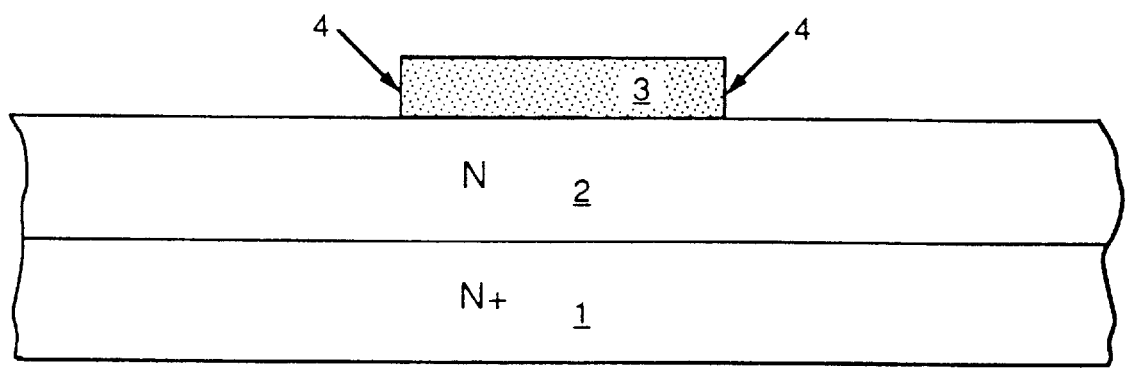

FIG. 2 is a view similar to that of FIG. 1 after patterning of oxide layer 3. The oxide layer can be patterned with any appropriate technique and in one embodiment is patterned using a conventional photoresist and a reactive ion etching process with CHF$_3$. Reactive ion etching is preferred because it provides an anisotropic etch that forms relatively smooth sidewalls. Sidewalls 4 of patterned oxide layer 3 are later used to form spacers and provide a vertical sidewall step for fabrication of the source/base junction and gate electrode, as discussed below.

Figure 3:
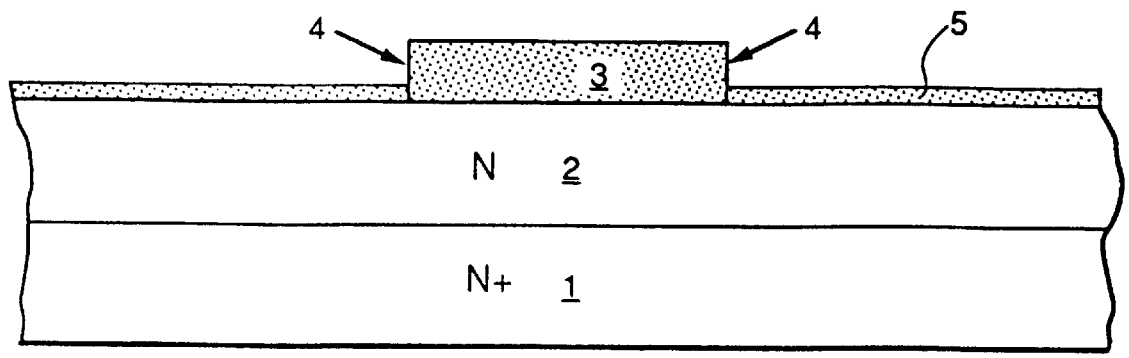

FIG. 3 is a view similar to that of FIG. 2 with the addition of a thin thermal oxide layer 5. The thin thermal oxide layer is grown where the deposited oxide layer 3 was removed. Preferably the thin thermal oxide has a thickness ranging from 300 Å to 1000 Å, and in one embodiment the thin thermal oxide layer comprises silicon dioxide having a thickness of about 300 Å. The thin thermal oxide is useful as an etch stop during spacer fabrication and for creating desired ion scattering and protecting the epitaxial layer during ion implantation.

Figure 4:
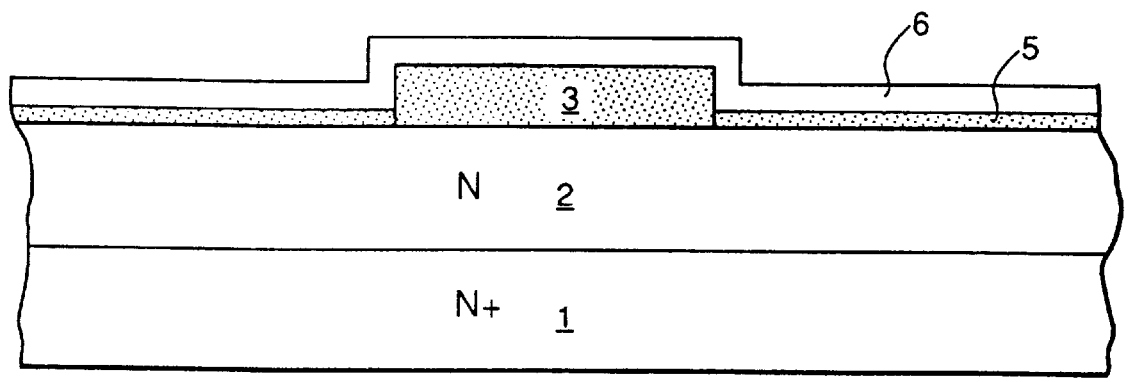

FIG. 4 is a view similar to that of FIG. 3 with the addition of a spacer layer 6. Preferably the spacer layer is formed by conformal deposition of silicon nitride material having a thickness ranging from 1000 Å to 3000 Å. In one embodiment the spacer layer is deposited using chemical vapor deposition (CVD) to a thickness of about 2000 Å. Other potential materials which may be used as spacer layers include silicon carbide or polysilicon, for example.

Figure 5:
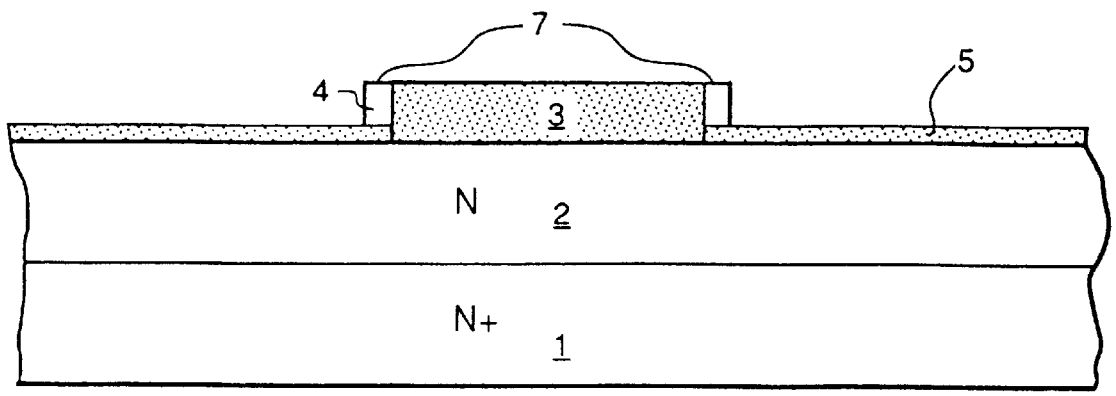

FIG. 5 is a view similar to that of FIG. 4 after the spacer layer has been etched. In one embodiment the etching is performed by reactive ion etching (RIE), which only etches vertically and therefore does not remove the portion of spacer layer 6 which is adjacent to the sidewalls 4 of patterned oxide layer 3. When the spacer layer comprises silicon nitride, a useful etchant is a CF$_4$/O$_2$ mixture with an RIE process. The RIE process is performed so as to end at thin thermal oxide layer 5 after the spacer layer has been removed from the major portion of thin thermal oxide layer 5 and therefore leaves a spacer 7 around patterned oxide layer 3 which is approximately the same thickness as patterned oxide layer 3 and is approximately the same width as the thickness of the deposited spacer layer (2000 Å in one embodiment). Typically, RIE machines have an end sensor which monitors spectrographic signals as the ions etch the surfaces and sends a signal to stop the etch process when the signals indicate that a different material is encountered by the ions. The material chosen for spacer layer 6 (and thus spacer 7) should be material that can later be removed without damaging sidewalls 4 of patterned oxide layer 3.

Figure 6:
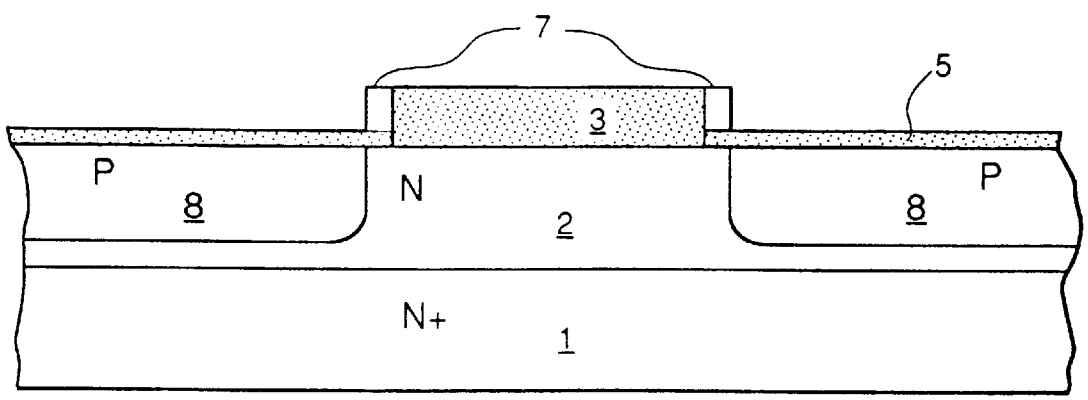

FIG. 6 is a view similar to that of FIG. 5 with the addition of a base region 8 comprising p type implanted ions in n type epitaxial layer 2. Before implanting the ions, an optional photoresist layer (not shown) can be applied and patterned. Spacer 7 is also used for providing a pattern for the implantation of ions. The purpose of having the spacer in addition to any optional photoresist is to provide more precise resolution than would be available with multiple photoresists. Spacer 7 is used to position the p type base region 8 under thin thermal oxide layer 5 and to ensure that it will be fully covered by the gate electrode when later applied.

In one embodiment, the base region is formed by implanting either boron or aluminum. For example, boron can be implanted at multiple energies up to 180 KeV with a dose of 5 to $10 \times 10^{14}$ ions/cm$^2$ to form base junction having a depth of 6000 Å. Because only oxide layers 3 and 5 and spacer 7 are present over the epitaxial layer, a high temperature implant is possible if desired. When the epitaxial layer comprises SiC, the energy used for supplying the dopant must be varied so that the dopant is uniformly dispersed throughout the desired volume. A multiple implant sequence having various doses and energies is needed to create a box profile because, unlike silicon, it is difficult to use heating to cause ions to diffuse to a desired depth in SiC. Computer programs which can model the proper doses and energies for the desired SiC application are commercially available. The implantation process is further discussed in M. Ghezzo et al., "Boron-implanted 6H-SiC diodes," Appl. Phys. Left., 30 Aug. 1993, pp. 1206–1208.

Figure 7:
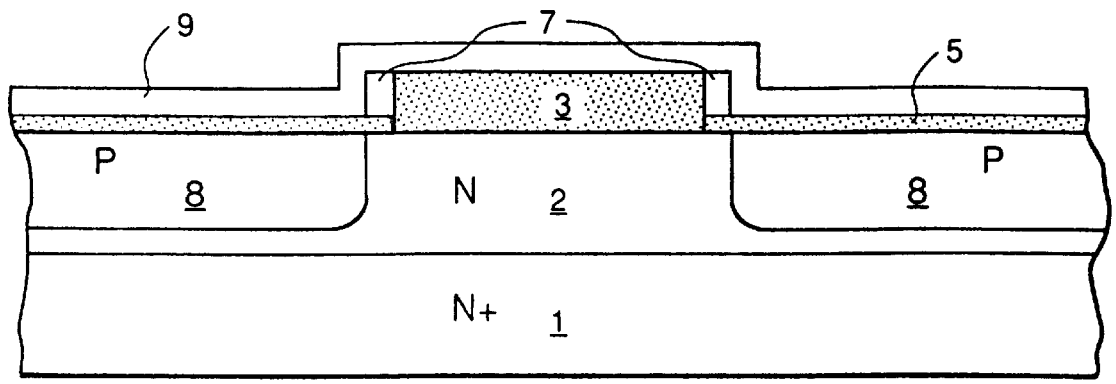

FIG. 7 is a view similar to that of FIG. 6 with the addition of a second spacer layer 9. Preferably second spacer layer 9 is a conformal silicon nitride layer deposited in the same manner as the first spacer layer 6 which was used to form the first spacer 7. In one embodiment a layer of silicon nitride is deposited to a thickness of 4,000 Å. The thickness of the second spacer is approximately equal to the channel length of the MOSFET.

Figure 8:
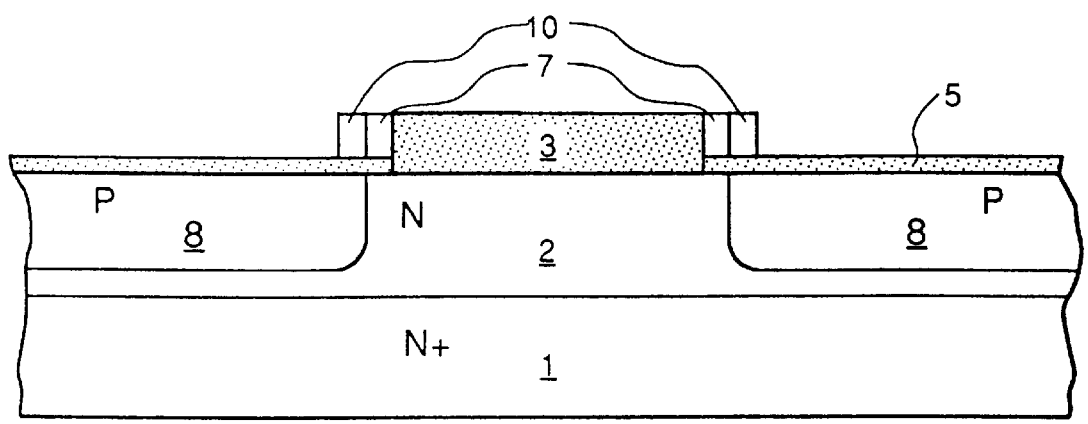

FIG. 8 is a view similar to that of FIG. 7 after the second spacer layer has been etched and a second spacer 10 has been formed, for example, by using RIE in a similar manner as first spacer 7. In one embodiment the second spacer width is about 4000Å with the combined width of the first and second spacers being about 6000 Å.

Figure 9:
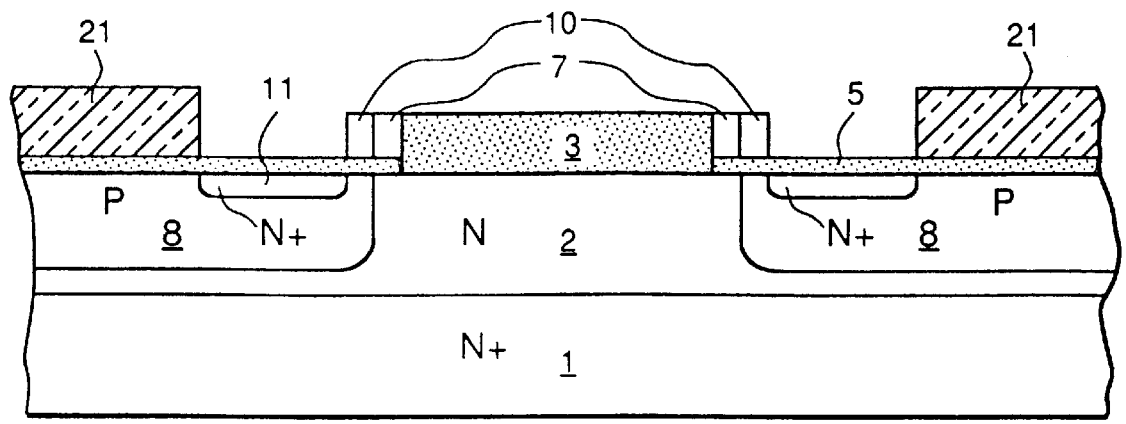

FIG. 9 is a view similar to that of FIG. 8 with the addition of a photoresist layer 21 and n+ type implanted ions in a source region 11 of the p type base region 8. The photoresist can be formed and patterned by conventional techniques and, as discussed with respect to FIG. 6, the spacers and photoresist layer can be used to precisely define a region for the n+ type source region implantation.

The n+ type source region is formed in a similar manner as the p type base region. In one embodiment, nitrogen is implanted with multiple energies up to 50 to 60 KeV and a dose of $2 \times 10^{16}$ ions/cm$^2$ to form a 2000 Å deep n+ source region. An implantation process is further discussed in M. Ghezzo et al., "Nitrogen-Implanted SiC Diodes Using High Temperature Implantation," IEEE Electron Device Letters 13, Dec. 1992, pp. 639–641. When ion implantation is used, the spacers ensure that the n+ region only overlaps a portion of the base region 8 and that the source is thus fully contained within the base region leaving adequate separation between the lateral junctions to form the MOS channel.

Figure 10:
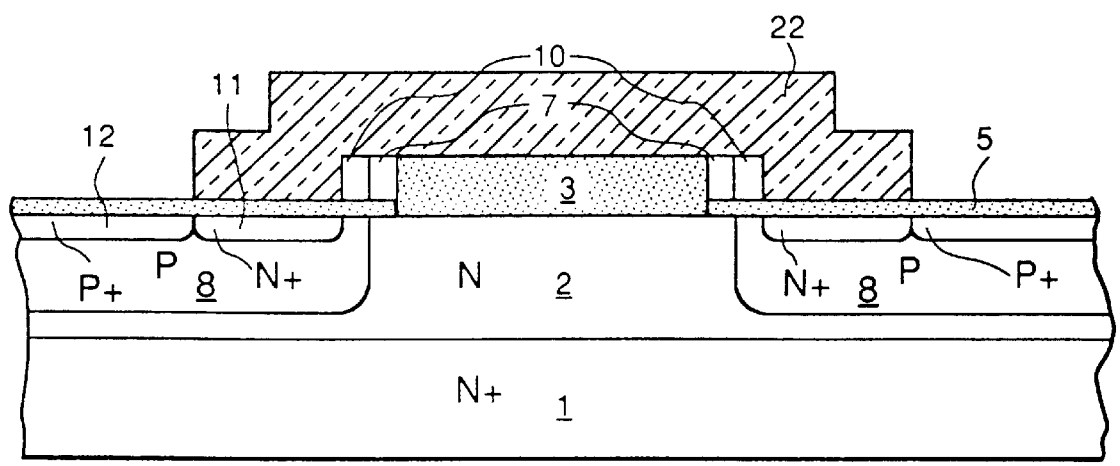

FIG. 10 is a view similar to that of FIG. 9 after the removal of the photoresist layer 21 of FIG. 9 and the addition of another patterned photoresist layer 22. To form a base contact region 12, the exposed portion of p type base region 8 is implanted with boron or aluminum at multiple energies up to 60 KeV with a dose of 1 or $2 \times 10^{16}$ ions/cm$^2$ to form a 2000 Å deep p+ region. Although an electrical connection can be made directly to the p type base region, the p+ base contact region provides an improved connection. In another embodiment, a trench (not shown) is patterned in the p type base region and the connection is made in the trench.

Figure 11:
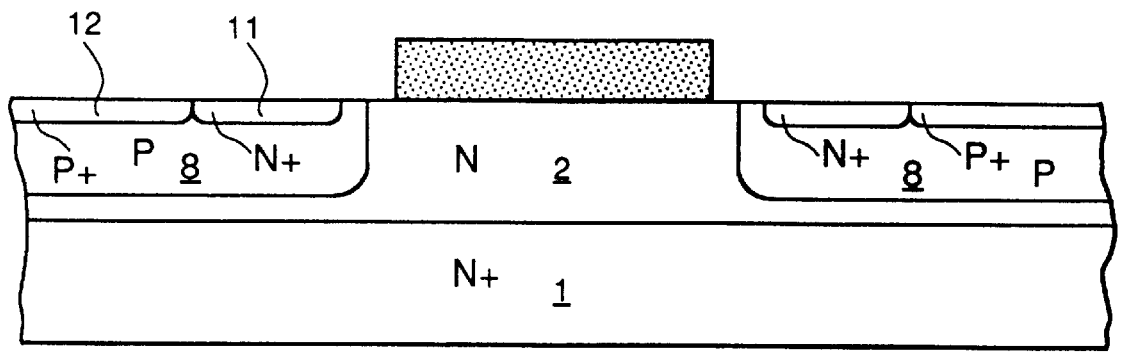

FIG. 11 is a view similar to that of FIG. 10 after the removal of photoresist layer 22 and the spacers 7 and 10. The spacers can be removed by any conventional manner, such as a RIE with CF$_4$/O$_2$, which was used to pattern the spacer layers or a wet etch in phosphoric acid, for example. The implanted regions are then annealed by heating the device in the temperature range of 1300° C. to 1500° C. for about 15 minutes in argon. Thin thermal oxide layer 5 is then removed.

Figure 12:
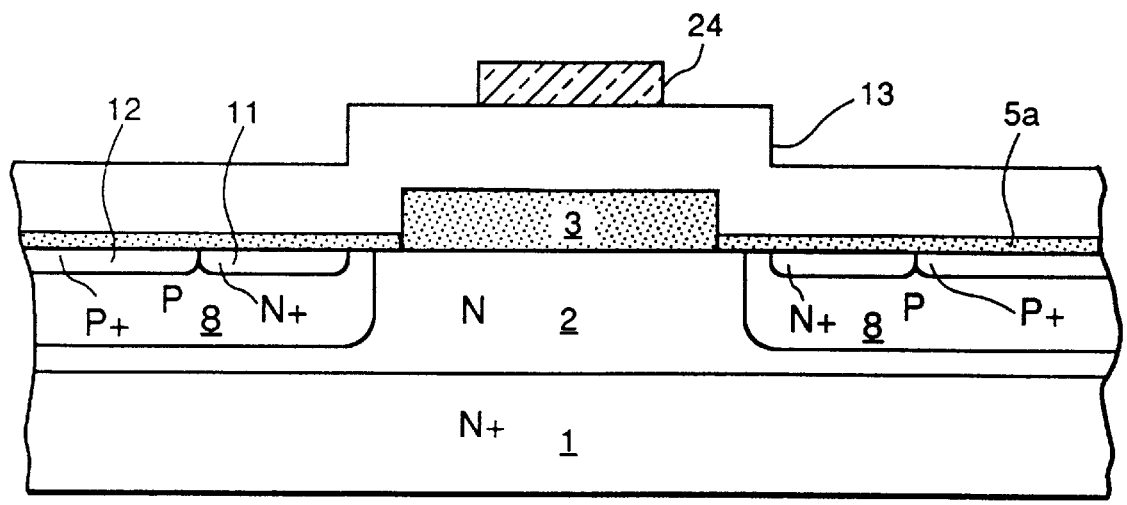

FIG. 12 is a view similar to that of FIG. 11 with the addition of a gate insulator material shown as second thermal oxide layer 5a and a gate electrode material layer 13. The second thermal oxide layer preferably comprises silicon dioxide applied having a thickness similar to that of the original thermal oxide layer 5, which in one example is about 300 Å. Other appropriate gate insulator materials can include silicon nitride and silicon oxynitride, for example. The removal of thin oxide layer 5 and application of a second thermal oxide layer is preferred because the thin oxide layer can be damaged during the etching of the spacer layers and spacers. Alternatively, the thin oxide layer can remain on epitaxial layer 2 to serve as the gate insulator material.

Gate electrode material layer 13 preferably comprises a refractory electrically conductive material such as polysilicon, molybdenum, tungsten, titanium silicide, molybdenum silicide, or cobalt silicide, for example. Preferably the gate electrode material layer is polysilicon having the same thickness as the combined width of the two spacers (6000 Å in one embodiment) and is conformally deposited by chemical vapor deposition (CVD) and heavily doped to its solid solubility limit (about $1 \times 10^{21}$ at/cm$^3$) with gaseous diffusion from a POCl$_3$ (phosphorous oxychloride) source.

After the gate electrode material layer 13 is applied, an optional layer of photoresist 24 can be applied over the gate electrode material layer in the region where a gate electrode interconnect 15 (shown in FIG. 13) can be formed.

Figure 13:
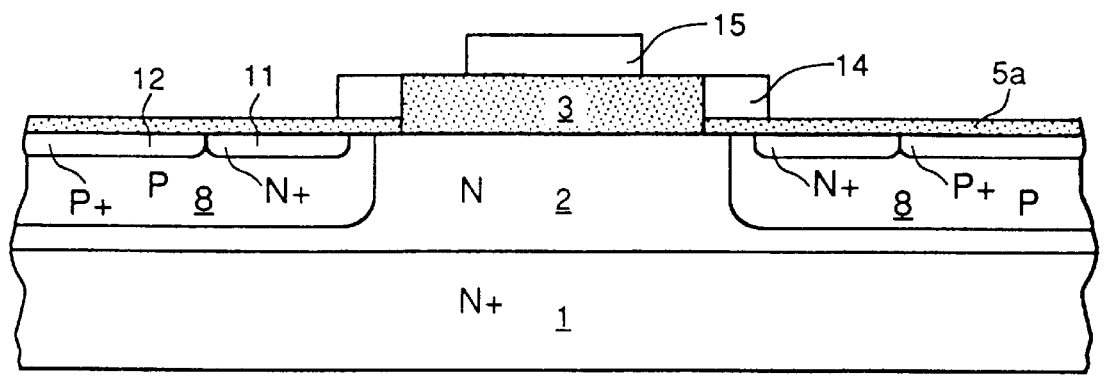

FIG. 13 is a view similar to that of FIG. 12 after the gate electrode material layer has been etched and the layer of photoresist has been removed. A blanket RIE etch generates a 6000 Å wide gate electrode 14 over the MOS channel, which includes the p type base region between the source and upper drain lateral junctions. Because this oxide step was previously used to define the junctions, the gate electrode is self-aligned. It is advantageous to form the gate electrode after implant annealing to avoid failures resulting from the associated high temperature treatment.

Preferably, the gate electrode 14 should extend completely over at least the portion of p type region 8 between the source region and the patterned oxide layer 3, and as little as possible over epitaxial layer 8 and n+ layer 11. Therefore, it is useful to keep the first spacer 7 thin enough that the area of epitaxial layer 2 under the gate electrode between base region 8 and patterned oxide layer 3 is as thin as possible but not so thin that any of the p type region would extend under oxide layer 3.

Figure 19:
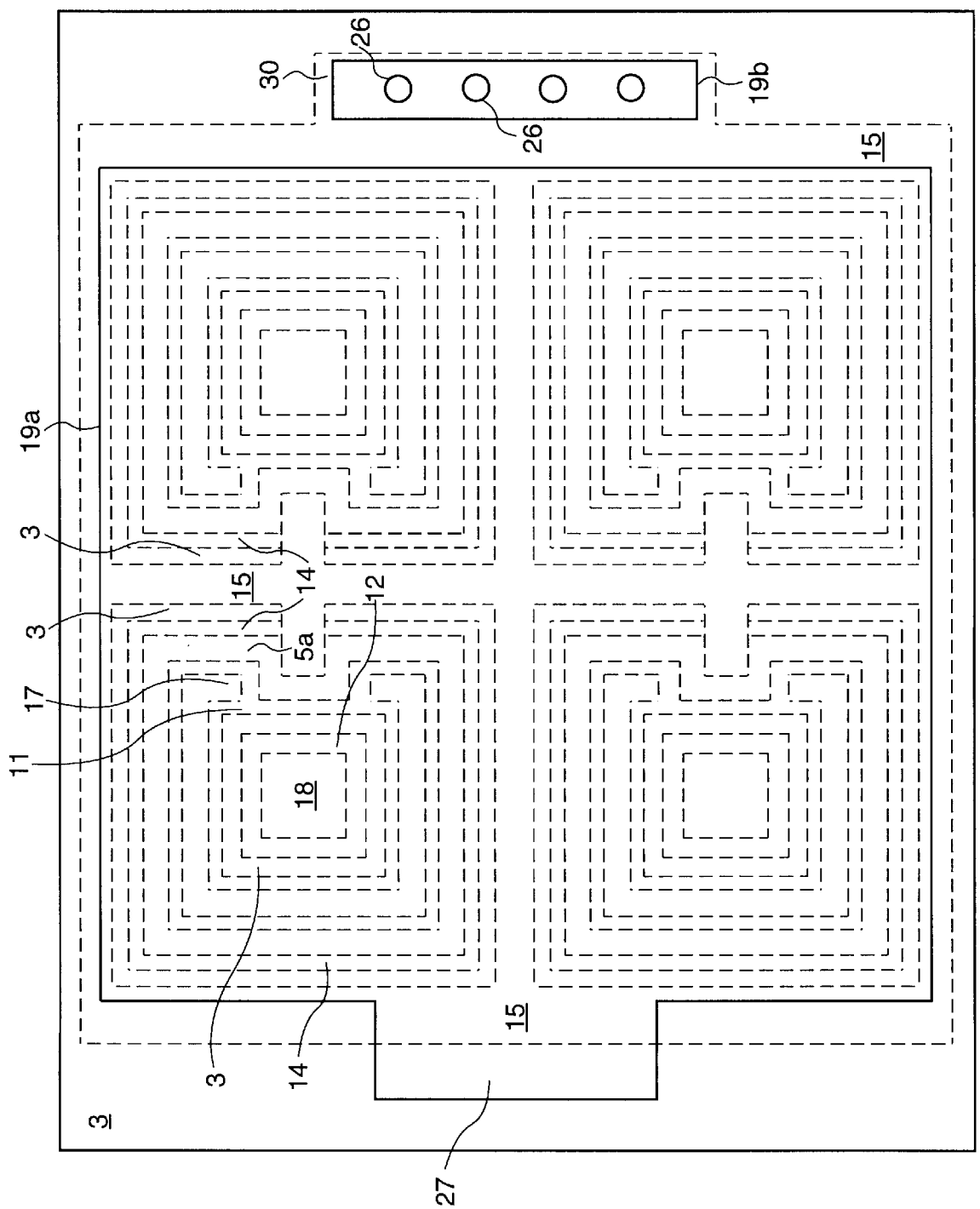
FIG. 19 is a top view of a self-aligned DMOS type device.

A top view of the patterned gate electrode 14 can be seen in FIG. 19 where portions of gate electrode 14 are coupled to the gate electrode interconnect 15 which extends to a gate contact region 30.

Figure 14:
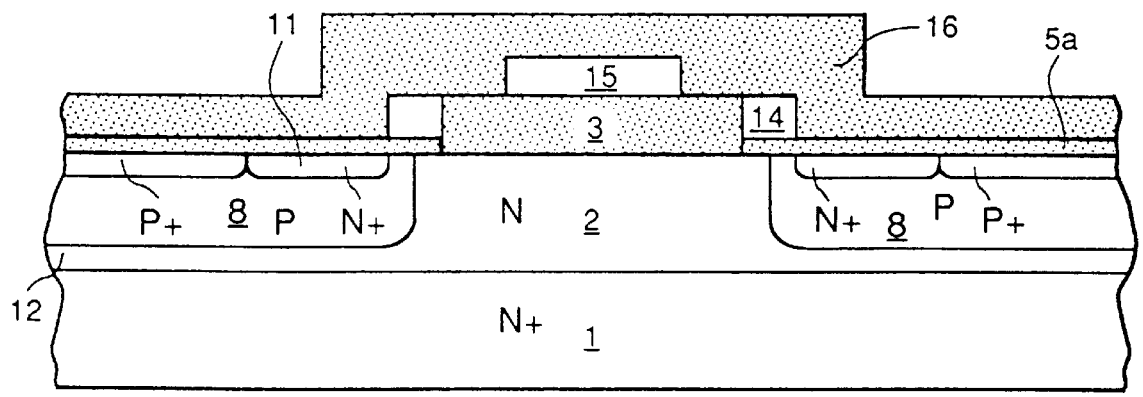

FIG. 14 is a view similar to that of FIG. 13 with the addition of an oxide layer 16. This oxide layer serves as an interlevel dielectric layer and in one embodiment is a chemical vapor deposited silicon dioxide layer having a thickness of 5000 Å.

Figure 15:
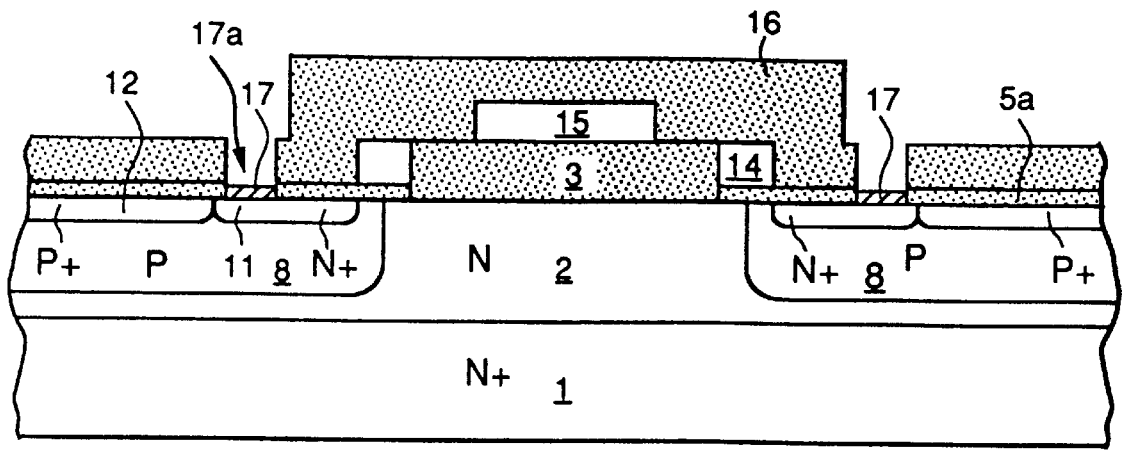

FIG. 15 is a view similar to that of FIG. 14 with vias 17a in oxide layer 16 and an electrically conductive source contact 17 over the exposed surface of source region 11. In one embodiment, the oxide layer is patterned by etching the vias. A conventional photoresist lift-off procedure can be used in which a photoresist layer (not shown) is applied and patterned to have vias corresponding to the vias of the oxide layer, source contact material is deposited, and the layer of photoresist with overlapping contact material is lifted away while leaving the source contact material over the source region. In one embodiment the source contact comprises nickel with a thickness of 500 Å which is deposited by sputtering. The nickel film remains only at the contact interface and is removed elsewhere together with the photoresist during the lift-off process.

Figure 16:
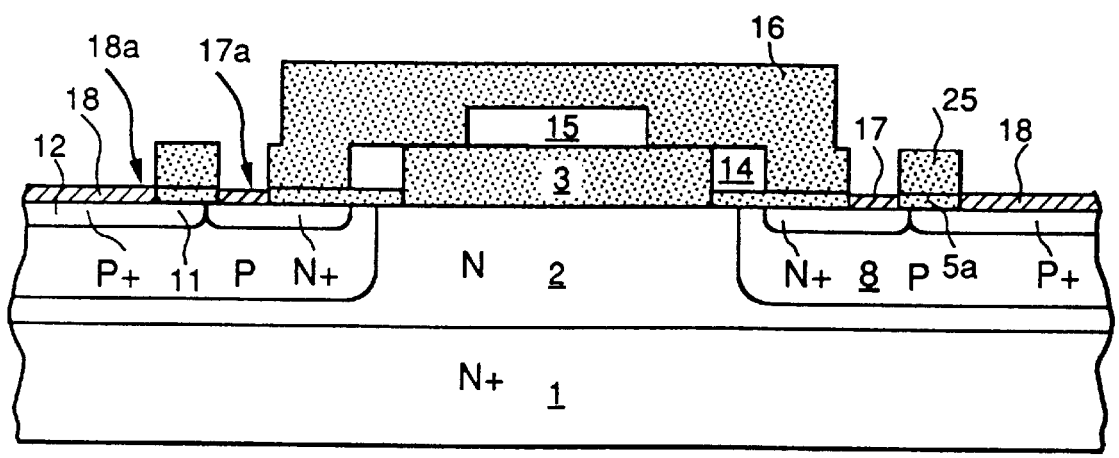

FIG. 16 is a view similar to that of FIG. 15 with additional vias 18a in the oxide layer and an electrically conductive base contact 18 over the exposed surface of the p+ type base contact region 12. Preferably, the oxide layer is patterned so as to leave a divider region 25 between the source contact region 11 and the base contact region. Base contact 18 is formed in a separate step from source contact 17 because the metallurgical interface layers for n+ and p+ type layers must be different. Unlike nickel, which is an effective contact metal for n+ type SiC material, the contact metal for p+ type SiC material is preferably one such as titanium and/or aluminum. In one embodiment, a 1700 Å thick layer of aluminum followed by a 600 Å thick layer of titanium can be deposited and patterned using a conventional photoresist lift-off technique, as discussed above, to make a good contact to base contact region 12.

Next the vias 26 (shown in FIG. 19) through oxide layer 16 to gate interconnects 15 are etched. Because the gate interconnects are already electrically conductive, no additional electrically conductive contact pad is needed.

Figure 17:
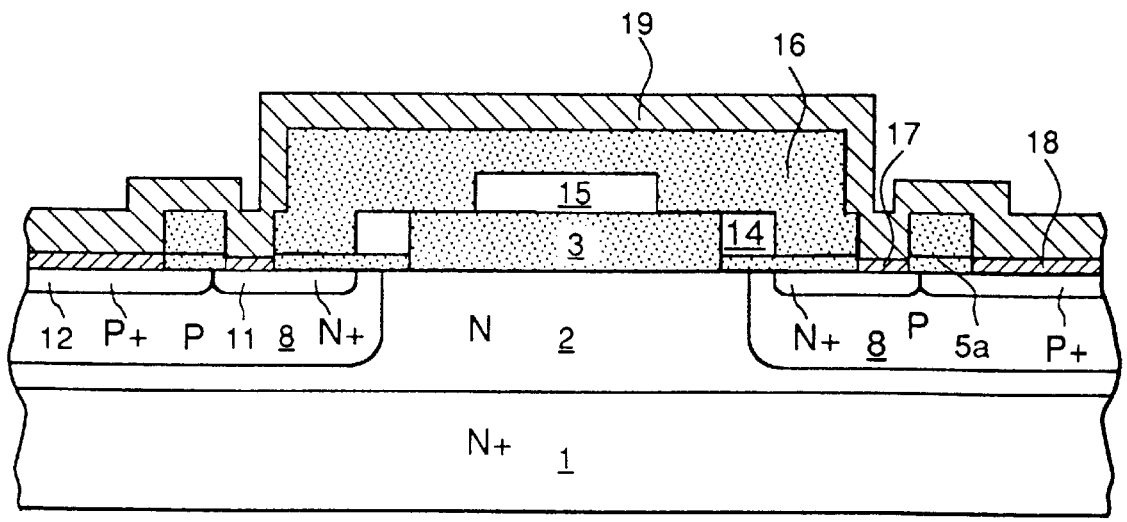

FIG. 17 is a view similar to that of FIG. 16 with the addition of an external layer of electrically conductive material 19. In one embodiment, the external layer is formed by sputtering a layer of titanium having a thickness of 2,000 Å, sputtering a layer of molybdenum having a thickness of 6,000 Å, and depositing a layer of gold having a thickness of 2 μm. The external layer can be etched into a desired pattern after deposition.

As shown in FIG. 19, in one embodiment, one portion 19a of the exterior layer can overlie and couple the source and base contacts whereas a separate second portion 19b can overlie and extend into the gate vias 26. The lithography requirements for second portion 19b are not stringent because the self-aligned gate electrodes 14 provide the important registration.

Figure 18:
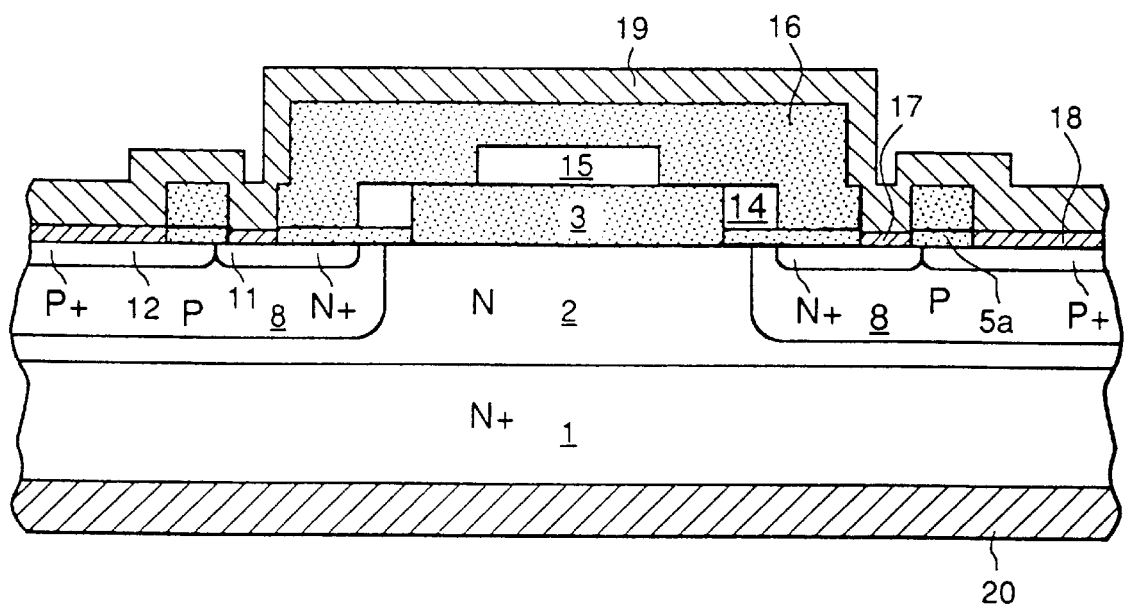

FIG. 18 is a view similar to that of FIG. 17 with the addition of a layer of electrically conductive material adjacent to substrate 1 which serves as a drain contact 20. The drain contact may comprise multiple refractory metal layers to satisfy bonding requirements between the structure and a module package. For example nickel, titanium, platinum, and gold can each be sputtered consecutively and each have respective thicknesses of 1 μm.

FIG. 19 is a top view of the embodiment shown and described with respect to FIGS. 17 and 18. Four MOS device regions are shown, although only a single device is required. Typically in a transistor devices there are a plurality of "cells" coupled together. External layer portion 19b can serve as the external connection pad of the gate. An extended portion 27 of external layer portion 19a can serve as the external connection pad of the source and base.

Figure 20:
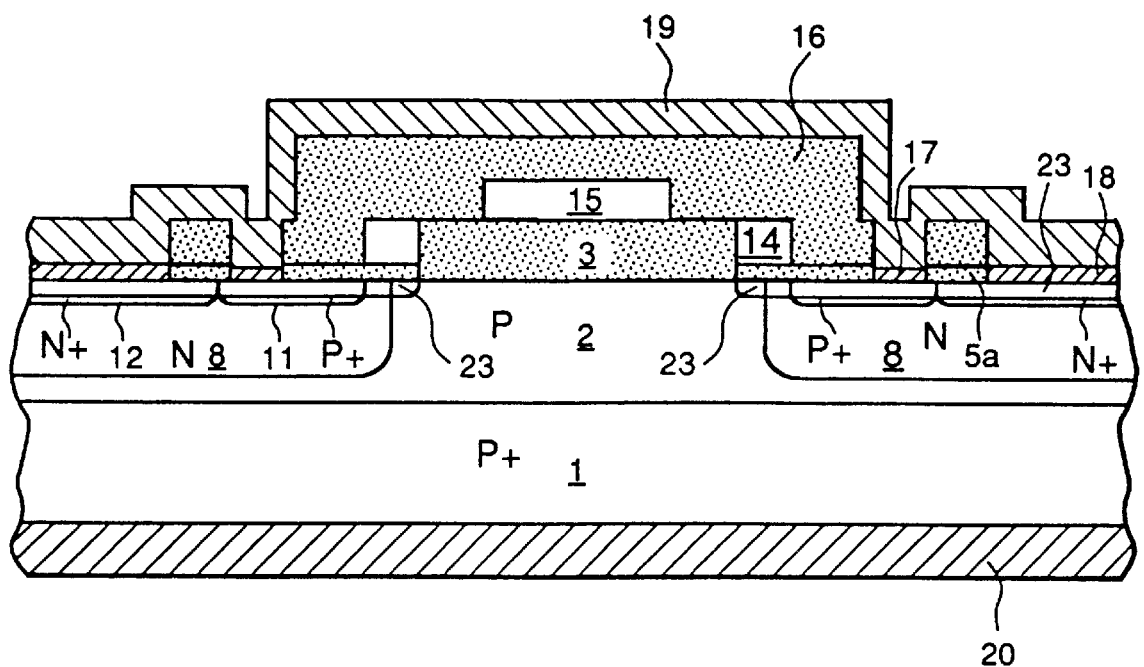
FIG. 20 is a sectional side view similar to that of FIG. 18 illustrating another embodiment of a DMOS type device.

FIG. 20 is a sectional side view similar to that of FIG. 18 illustrating another embodiment of a DMOS type device. This embodiment illustrates another advantage of the present invention which is the possibility of adjusting the threshold voltage with a light implant of, for example, $1\times10^{13}$–$1\times10^{14}$ at/cm$^3$ to a depth of about 500 Å, because the gate is formed after all the implants are done and activated. In a conventional device a threshold control implant region 23 is not feasible because the source/base annealing cycle follows gate formation, causing excessive dopant redistribution of the threshold implant profile with attendant loss of threshold adjusting action.

Preferably the threshold control implantation is performed after the spacers are removed. If an enhancement mode device is desired the implanted ions should be of the same type as those of the base region. If a depletion mode device is desired the implanted ions should be of the same type as those of the source region.

FIG. 20 further shows an embodiment wherein the polarities of each of substrate 1, epitaxial layer 2, base region 8, source region 11, and base contact region 12 are switched from those of FIG. 18.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A semiconductor device comprising:

a substrate comprising a semiconductor and having an epitaxial layer surface opposite a drain contact surface;

a semiconductor layer adjacent to the epitaxial layer surface of the substrate, the semiconductor layer comprising silicon carbide material of a first conductivity type;

a patterned refractory dielectric layer adjacent to the semiconductor layer;

a base region of implanted ions in the semiconductor layer, the base region being of a second conductivity type;

a source region of implanted ions in the base region, the source region being of the first conductivity type, the source region having a self-registered edge shifted with respect to the base region;

a gate insulator layer adjacent to at least a portion of the source and base regions of the semiconductor layer; and a gate electrode over a portion of the gate insulator layer, adjacent to and in physical contact with an outer edge of the patterned refractory dielectric layer, and over at least a portion of the base region between the source region and the patterned refractory dielectric layer.

2. The semiconductor device of claim 1, wherein the gate insulator layer comprises silicon dioxide.

3. The semiconductor device of claim 1, further including a threshold voltage control region of implanted ions over at least a portion of the source and base regions.

4. The semiconductor device of claim 2, wherein the gate electrode layer comprises polysilicon.

5. The semiconductor device of claim 4, further including a contact region of implanted ions in the base region, the contact region being of the second conductivity type.

6. The semiconductor device of claim 4, further including a gate electrode interconnect comprising polysilicon at least partially situated over the patterned refractory dielectric layer and coupled to the gate electrode.

7. The semiconductor device of claim 4, wherein the substrate is of the first conductivity type.

8. The semiconductor device of claim 4, wherein the substrate is of the second conductivity type.

9. The semiconductor device of claim 6, further including:

an oxide layer over the semiconductor layer, the patterned refractory dielectric layer, the gate electrode, and the gate electrode interconnect and having respective vias extending to the source region, the base region, and the gate electrode interconnect;

electrically conductive contacts in the vias adjacent to the source region and the base region;

an external layer of electrically conductive material over the oxide layer and extending into the vias, a first portion coupling the electrically conductive contacts and a second portion extending through a respective via to the gate electrode interconnect; and an electrically conductive drain layer adjacent to the drain contact surface of the substrate.

* * * * *